(12) United States Patent
Kramer et al.

(10) Patent No.: US 6,426,295 B1
(45) Date of Patent: Jul. 30, 2002

(54) REDUCTION OF SURFACE ROUGHNESS DURING CHEMICAL MECHANICAL PLANARIZATION(CMP)

(75) Inventors: Stephen J. Kramer; Scott G. Meikle, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/584,468

(22) Filed: May 31, 2000

(51) Int. Cl.[7] .............................................. H01L 21/00
(52) U.S. Cl. ...................... 438/692; 156/345; 216/38; 216/88; 216/89; 252/79.1; 438/693; 438/745
(58) Field of Search .................. 438/691, 692, 438/693, 745, 753, 756; 252/79.1, 79.4; 216/38, 88, 89; 156/345 LP

(56) References Cited

U.S. PATENT DOCUMENTS

| | | | |
|---|---|---|---|
| 4,070,797 A | * | 1/1978 | Griesshammer et al. ....... 51/326 |
| 4,156,619 A | * | 5/1979 | Griesshammer ................ 134/2 |
| 4,563,257 A | * | 1/1986 | Sova ..................... 204/129.85 |
| 4,724,042 A | * | 2/1988 | Sherman ...................... 156/637 |
| 5,193,316 A | * | 3/1993 | Olmstead ................. 51/281 SF |
| 5,320,706 A | * | 6/1994 | Blackwell ................... 156/636 |
| 5,489,233 A | * | 2/1996 | Cook ........................... 451/41 |
| 5,584,146 A | * | 12/1996 | Shamouillan et al. ......... 51/293 |
| 5,616,212 A | * | 4/1997 | Isobe ......................... 438/693 |
| 5,704,987 A | * | 1/1998 | Huynh et al. .................. 134/6 |
| 5,738,800 A | * | 4/1998 | Hosali et al. ................. 216/99 |
| 5,759,917 A | * | 6/1998 | Grover et al. .......... 438/693 X |
| 5,930,645 A | * | 7/1999 | Lyons et al. ................. 438/424 |
| 6,046,112 A | * | 4/2000 | Wang ......................... 438/693 |

OTHER PUBLICATIONS

*McGraw–Hill Concise Encyclopedia of Science& Technology*, Fourth Edition, pp. 1931–1932, (1998).*

Hiemenz, P.C., *Principles of Colloid and Surface Chemistry*, 2nd ed., Marcell Dekker, Inc., New York, 428–435, (1986).*

* cited by examiner

*Primary Examiner*—William A. Powell
(74) *Attorney, Agent, or Firm*—Schwegman, Lundberg, Woessner & Kluth, P.A.

(57) ABSTRACT

Improved methods, compositions and structures formed therefrom are provided that allow for reduction of roughness in layers (e.g., oxide layers) of a planarized wafer. In one such embodiment, improved methods, compositions and structures formed therefrom for reduction of roughness in layers (e.g., oxide layers) of a planarized wafer are used in conjunction with high modulus polyurethane pads. In one embodiment, improved methods, compositions and structures formed therefrom are provided that reduce rough interlayer dielectric (ILD) conditions for a wafer during CMP processing of such a wafer. Accordingly, this reduction of rough ILD reduces "chatter scratches" which are scratches that emanate from regions of a wafer that has undergone CMP processing. Advantageously, reduction in "chatter scratching" reduces cracking (i.e., "wormholing") in layers of the wafer that have been planarized. Therefore, reduction in cracking decreases access of cleaning chemistries to underlying structures of the wafer during subsequent chemical cleaning of the planarized wafer, thereby reducing damage to such underlying structures from these cleaning chemistries (e.g., reduction of metal voids in underlying metal structures). Embodiments of a method for forming a microelectronic substrate include mixing a surfactant at least 100 parts per million (ppm) to slurries to form a polishing solution. The method also includes chemical-mechanical planarizing of the semiconductor wafer using the polishing solution. Additionally, embodiments of a polishing solution for chemical-mechanical planarizing a microelectronic substrate includes slurries and a surfactant at least 100 parts per million (ppm) to the slurries.

63 Claims, 6 Drawing Sheets

REDUCTION OF SURFACE ROUGHNESS DURING CHEMICAL MECHANICAL PLANARIZATION(CMP)

FIELD OF THE INVENTION

The present invention relates to semiconductor wafer manufacturing and more particularly to improved composition, use and method for reduction of surface roughness of such wafers during chemical-mechanical planarization (CMP).

BACKGROUND OF THE INVENTION

Chemical-mechanical planarization (CMP) processes are applied in the manufacturing of integrated circuits and other electronic devices for the removal of unwanted material from the surface of semiconductor wafers and other microelectronic device substrate assemblies. Additionally, the CMP processes are used in conjunction with the planarization and polishing of such surfaces subsequent to the deposition of layers of metal and insulation.

In particular, mechanical and chemical-mechanical planarization processes ("CMP") are used in the manufacturing of electronic devices for forming a flat surface on semiconductor wafers, field emission displays and many other microelectronic-device substrate assemblies. CMP processes generally remove material from a wafer assembly to create a highly planar surface at a precise elevation in the layers of material on the wafer assembly. Referring to FIG. 1, there is shown a cross-sectional view of a portion of a CMP system 100 that includes wafer carrier assembly 104, platen 106, under-pad 108, CMP pad 110, CMP pad drive shaft 112, motor 116 and motor/downward force applicator/sensor assembly 118. CMP pad 110 is a conventional pad. In operation, wafer carrier assembly 104 maintains wafer assembly 120 in position for CMP in a manner known in the art. Additionally, polishing solution 102 is applied to CMP pad 110 for removing material from wafer assembly 120.

Accordingly, CMP pad 110 and polishing solution 102 define a planarizing medium that mechanically and/or chemically-mechanically removes material from the surface of the wafer assembly 120. In certain applications, CMP pad 110 may be a non-abrasive pad without abrasive particles, composed of a polymeric material (e.g., polyurethane) or other suitable materials. Polishing solution 120 used with the non-abrasive planarizing pads are typically CMP slurries with abrasive particles and chemicals to remove material from a substrate.

Further, CMP processing has moved to the use and application of CMP pads having higher modulus polyurethane pads to increase die uniformity and reduce the range of thickness variation across the wafer being polished. A major drawback to this process has been the propensity for these hard pads to be associated with a phenomenon referred to as "rough oxide" or "rough interlayer dielectric (ILD)", especially on ILD polishes. Rough oxide is a condition where rough areas are created on the wafer, usually periodically spaced, in periphery (i.e., low topography) regions as the wafer is polished to planarity. This roughness can include a slurry gelation or removed glass redeposition at the surface. When such roughness becomes excessive, scratches can emanate from these regions causing "chatter scratches" that tend to cause localized cracking in the oxide (i.e., "wormholing"). In an ILD film, this "wormholing" can provide channeling of subsequent cleaning chemistries, such as Tetra Methyl Ammonia Hydroxide (TMAH), to underlying metal structures, thus creating metal voids in the integrated circuit within such wafers. Further, this roughness caused by the slurry properties is more apt to happen when the slurry particle has a large surface area with respect to its volume (i.e., a highly fractal structure (e.g., fumed silicas like ILD 1300) and/or a small diameter (e.g., small colloidal silicas like Klebosol 30N20)). Accordingly, this roughness phenomenon becomes worse with a combination of a small diameter and a high fractal nature with regard to the slurry particle.

Moreover, this "rough oxide" phenomenon can also happen while performing shallow trench isolation (STI) CMP processing. STI is not used in the creation of a planarized layer, but, rather, in the formation of planarized isolation features. With STI, scratching and cracking can cause an electrical leakage, pathway and/or electrical shorts. In particular, scratching at STI CMP can create voids in or elimination of the STI oxide, thereby reducing or eliminating the isolation in the silicon. Further, cracks in the oxide or underlying nitride CMP stop layer can cause damage to the base silicon. Accordingly, in subsequent processing steps, cracks or scratches in the oxide or base silicon may be filled with metal used during the formation of wordlines, thereby creating electrical shorts.

Accordingly, there is a need for compositions, uses and methods for reduction of surface roughness during chemical-mechanical planarization (CMP). For these and other reasons there is a need for the present invention.

SUMMARY OF THE INVENTION

The above-mentioned problems and limitations associated with surface roughness during chemical-mechanical polishing (CMP) of semiconductor wafers and other problems are addressed by the present invention and will be understood by reading and studying the following specification. Compositions, methods and use are described which accord improved benefits.

Improved methods, compositions and structures formed therefrom are provided that allow for reduction of roughness in layers (e.g., oxide layers) of a planarized wafer. In one such embodiment, improved methods, compositions and structures formed therefrom for reduction of roughness in layers (e.g., oxide layers) of a planarized wafer are used in conjunction with high modulus polyurethane pads. In one embodiment, improved methods, compositions and structures formed therefrom are provided that reduce rough interlayer dielectric (ILD) conditions for a wafer during CMP processing of such a wafer. Accordingly, this reduction of rough ILD reduces "chatter scratches" which are scratches that emanate from regions of a wafer that has undergone CMP processing. Advantageously, reduction in "chatter scratching" reduces cracking (i.e., "wormholing") in layers of the wafer that have been planarized. Therefore, reduction in cracking decreases access of cleaning chemistries to underlying structures of the wafer during subsequent chemical cleaning of the planarized wafer, thereby reducing damage to such underlying structures from these cleaning chemistries (e.g., reduction of metal voids in underlying metal structures).

Moreover, in one embodiment, improved methods, compositions and structures formed therefrom are provided that reduces this roughness in layers of a planarized wafer used in conjunction with CMP shallow trench isolation (STI). Accordingly, this reduction of roughness reduces scratching and cracking of the layers (e.g., oxide layer or nitride CMP stop layer) of the planarized wafer during the STI process. Therefore, reduction in scratching and cracking of the layers reduces the formation of electrical shorts caused during the subsequent processing of the wafer when metal is layered for the formation of metallized layers (e.g., for the formation of wordlines).

Embodiments of a method for forming a microelectronic substrate include mixing a surfactant at least 100 parts per million (ppm) to slurries to form a polishing solution. The method also includes chemical-mechanical planarizing of the semiconductor wafer using the polishing solution. Additionally, embodiments of a polishing solution for chemical-mechanical planarizing a microelectronic substrate includes slurries and a surfactant at least 100 parts per million (ppm) to the slurries.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION

Figure 1:
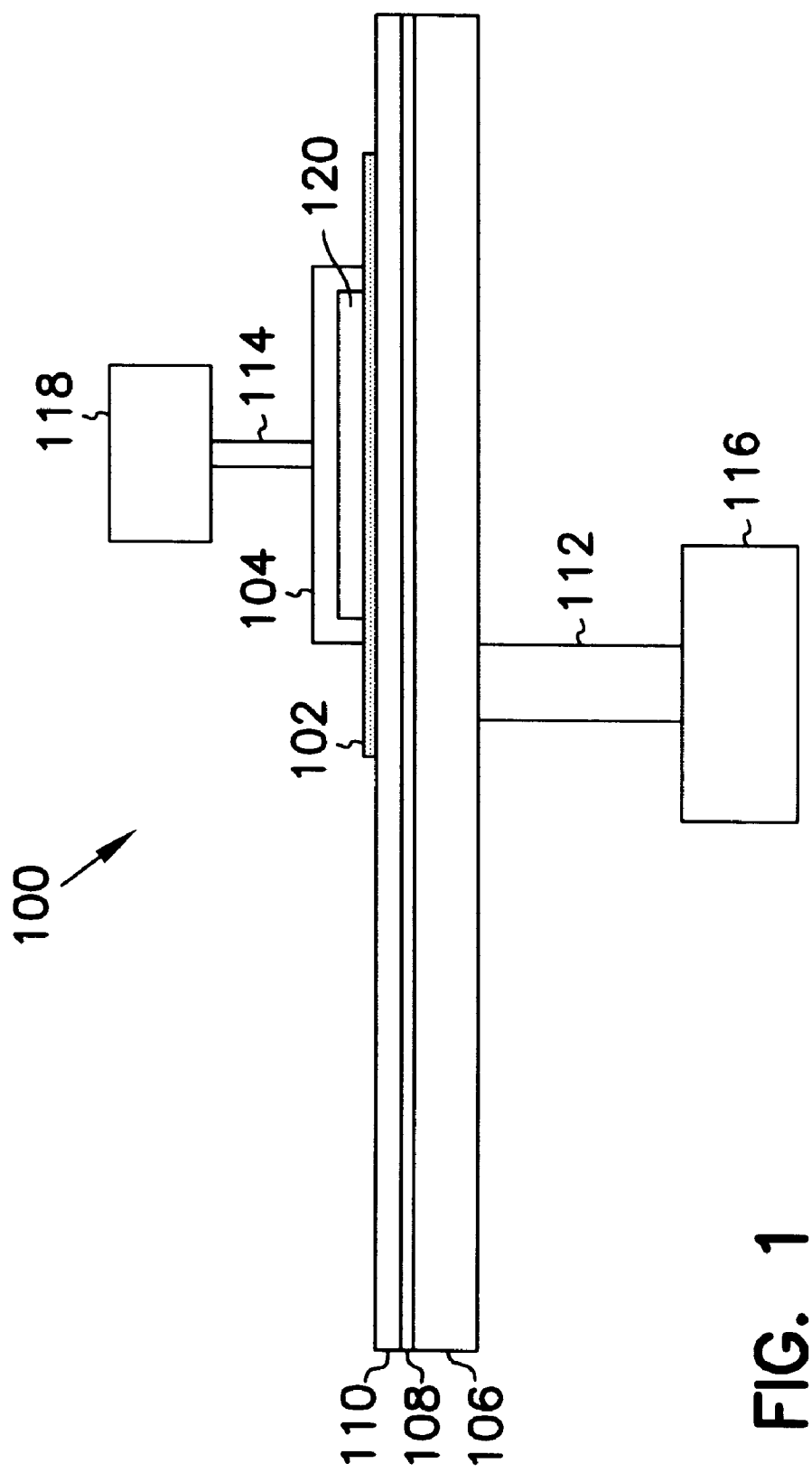
FIG. 1 is a cross-sectional view of a portion of a conventional CMP system.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

Reference in the specification to "an embodiment," "one embodiment," "some embodiments," or "other embodiments" means that a particular feature, structure, or characteristic described in connection with the embodiments is included in at least some embodiments, but not necessarily all embodiments, of the invention. The various appearances "an embodiment," "one embodiment," or "some embodiments" are not necessarily all referring to the same embodiments.

If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

Figure 2:
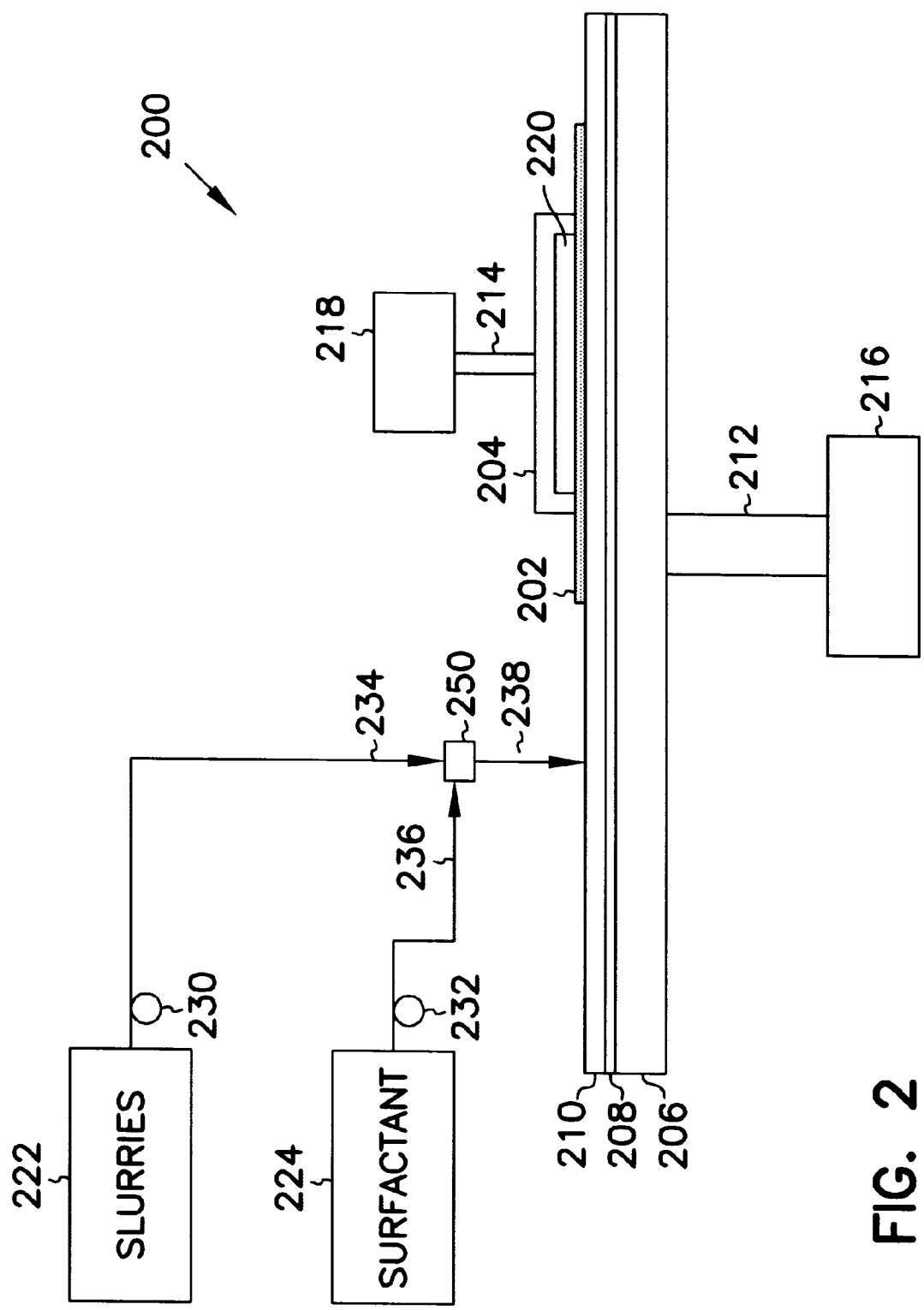
FIG. 2 is a cross-sectional view a portion of an embodiment of a CMP system in accordance with embodiments of the present invention.

Referring to FIG. 2, there is shown a cross-sectional view of a portion of a CMP system 200 employing polishing solution 202 in accordance with embodiments of the present invention. CMP system 200 includes wafer carrier assembly 204, platen 206, under-pad 208, CMP pad 210, CMP pad drive shaft 212, motor 216 and motor/downward force applicator/sensor assembly 218. CMP pad 210 may be a conventional pad. In one embodiment, CMP pad 210 is a high modulus polyurethane pad. In one embodiment, CMP pad 210 is a polishing pad having a polymer hardness of at least 60 Shore D. In one embodiment, CMP pad 210 is a polishing pad having a moduli, flexural modulus at 30 degrees Celsius of $0.5 \times 10^9$ Pascals (Pa) to $3 \times 10^9$ Pa.

In operation, wafer carrier assembly 204 maintains wafer assembly 220 in position for CMP in a manner known in the art. Additionally, polishing solution 202 is applied to CMP pad 210 for removing material from wafer assembly 220. FIG. 2 includes CMP system 200 wherein slurries 222 and surfactant 224 are mixed in line during the delivery of slurries 222 and surfactant 224 to CMP pad 210. In one embodiment, slurries 222 and surfactant 224 are pumped by pumps 230 and 232, respectively, through feed tubes 234 and 236, respectively, to feed point 250. Accordingly, slurries 222 and surfactant 224 are combined at feed point 250 and delivered to CMP pad 210 through feed tube 238. In one embodiment, slurries 222 are defined to include mixtures that contain a liquid. Accordingly, slurries 222 provide for the planarization of wafer assembly 220, while surfactant 224 precludes defects during this planarization process.

Polishing solution 202 in accordance with embodiments of the present invention includes slurries 222 and surfactant 224. In one embodiment, slurries 222 is fumed silica slurries, as is known in the art. One such commercial embodiment includes ILD 1300 (Rodel).

Further, as used herein, a "surfactant" is a substance that even though present in relatively small amounts, can exert a marked effect on the surface behavior of a system. These substances (i.e., agents) are essentially responsible for producing great changes in the surface energy of liquid or solid surfaces, and their ability to cause these changes is associated with their tendency to migrate to the interface between two phases. Surfactants are usually classified in three groups: anionic, cationic, and nonionic types. Anionic types include carboxylate ions such as occur in sodium oleate.

Cationic surfactants are usually derived from the amino group where through either primary, secondary, or tertiary amine salts, the hydrophillic character may be achieved by aliphatic and aromatic groups that may be altered by substituients of varying polarity. The third class of surfactants, the nonionic type, are organic substances that contain groups of varying polarity and that render parts of the molecule lypophillic, whereas other parts of the molecule are lypophobic. In this class are often included certain colloidal substances, such as graphite and clays. McGraw-Hill Concise Encyclopedia of Science & Technology, Fourth Edition, 1998, pp. 1931–1932.

Any suitable surfactant can be employed, provided the surfactant can effectively mitigate the defect causing state. Preferably, the surfactant can be a nonionic surfactant. Any suitable nonionic surfactant can be employed, provided the surfactant can effectively mitigate the defect causing state. Suitable nonionic surfactants include, for example, brij® 30 (i.e., polyoxyethylene(4) lauryl ether); brij® 35 (i.e., polyoxyethylene(23) lauryl ether); brij® 52 (i.e., polyoxyethylene(2) cetyl ether); brij® 56 (i.e., polyoxyethylene(10) cetyl ether); brij® 58 (i.e., polyoxyethylene(20) cetyl ether); brij® 72 (i.e., polyoxyethylene(2) steryl ether); brij® 76 (i.e., polyoxyethylene(10) steryl ether); brij® 78 (i.e., polyoxyethylene(20) steryl ether); brij® 92 (i.e., polyoxyethylene(2) oleyl ether); brij® 97 (i.e., polyoxyethylene(10) oleyl ether); brij® 98 (i.e., polyoxyethylene(20) oleyl ether); and brij® 7000 (i.e., polyoxyethylene(100) steryl ether), which are all commercially available from Aldrich Chemicals (Milwaukee, Wis.).

Preferably, the nonionic surfactant can be a compound of the formula $CH_3R^1(OR^2)_nOH$, wherein $R^1$ is $(C_5–C_{50})$ alkenyl, $R_2$ is $(C_2–C_8)$alkenyl, and n is about 5 to about 50. Preferably, $R^1$ can be $(CH_2)_{15}$. Preferably, $R^2$ can be ethylene, (i.e., $CH_2CH_2$). Preferably, n can be about 20. It has been surprisingly discovered that brij® 58 (i.e., polyoxycthylene(20) cetyl ether) is one suitable surfactant useful in the present invention.

As used herein, "alkenyl" is a saturated, branched or unbranched, hydrocarbon that contains two open sites to bond to other groups. $(C_2–C_8)$alkenyl can include, for example, vinyl, allyl, 1-propenyl, 2-propenyl, 1-butenyl, 2-butenyl, 3-butenyl, 1,-pentenyl, 2-pentenyl, 3-pentenyl, 4-pentenyl, 1- hexenyl, 2-hexenyl, 3-hexenyl, 4-hexenyl, 5-hexenyl, 1-heptenyl, 2-heptenyl, 3-heptenyl, 4-heptenyl, 5-heptenyl, 6-heptenyl, 1-octenyl, 2-octenyl, 3-octenyl, 4-octenyl, 5-octenyl, 6-octenyl, and 7-octenyl.

$(C_5–C_{50})$alkenyl can include, for example, 1,-pentenyl, 2-pentenyl, 3-pentenyl, 4-pentenyl, 1- hexenyl, 2-hexenyl, 3-hexenyl, 4-hexenyl, 5-hexenyl, 1-heptenyl, 2-heptenyl, 3-heptenyl, 4-heptenyl, 5-heptenyl, 6-heptenyl, 1-octenyl, 2-octenyl, 3-octenyl, 4-octenyl, 5-octenyl, 6-octenyl, 7-octenyl, 1-nonenyl, 2-nonenyl, 3-nonenyl, 4-nonenyl, 5-nonenyl, 6-nonenyl, 7-nonenyl, 8-nonenyl, 1-decenyl, 2-decenyl, 3-decenyl, 4-decenyl, 5-decenyl, 6-decenyl, 7-decenyl, 8-decenyl, 9-decenyl, 1-undecenyl, 2-undecenyl, 3-undecenyl, 4-undecenyl, 5-undecenyl, 6-undecenyl, 7-undecenyl, 8-undecenyl, 9-undecenyl, 10-undecenyl, 1-dodecenyl, 2-dodecenyl, 3-dodecenyl, 4-dodecenyl, 5-dodecenyl, 6-dodecenyl, 7-dodecenyl, 8-dodecenyl, 9-dodecenyl, 10-dodecenyl, 11-dodecenyl, 1-tridecenyl, 2-tridecenyl, 3-tridecenyl, 4-tridecenyl, 5-tridecenyl, 6-tridecenyl, 7-tridecenyl, 8-tridecenyl, 9-tridecenyl, 10-tridecenyl, 11-tridecenyl, 12-tridecenyl, 1-tetradecenyl, 2-tetradecenyl, 3-tetradecenyl, 4-tetradecenyl, 5-tetradecenyl, 6-tetradecenyl, 7-tetradecenyl, 8-tetradecenyl, 9-tetradecenyl, 10-tetradecenyl, 11-tetradecenyl, 12-tetradecenyl, 13-tetradecenyl, 1-eicosanenyl, 2-eicosanenyl, 3-eicosenyl, 4-eicosenyl, 5-eicosenyl, 6-eicosenyl, 7-eicosenyl, 8-eicosenyl, 9-eicosenyl, 10-eicosenyl, 11-eicosenyl, 12-eicosenyl, 13-eicosenyl, 14-eicosenyl, 15-eicosenyl, 16-eicosenyl, 17-eicosenyl, 18-eicosenyl, 19-eicosenyl, 1-triacontenyl, 2-triacontenyl, 3-triacontenyl, 4-triacontenyl, 5-triacontenyl, 6-triacontenyl, 7-triacontenyl, 8-triacontenyl, 9-triacontenyl, 10-triacontenyl, 11-triacontenyl,12-triacontenyl, 13-triacontenyl, 14-triacontenyl, 15-triacontenyl, 16-triacontenyl, 17-triacontenyl, 18-triacontenyl, 19-triacontenyl, 20-triacontenyl, 21-triacontenyl, 22-triacontenyl, 23-triacontenyl, 24-triacontenyl, 25-triacontenyl, 26-triacontenyl, 27-triacontenyl, 28-triacontenyl, and 29-triacontenyl.

In one embodiment, the surfactant can be a long chained surfactant molecule. As used herein, a long chained surfactant molecule is a surfactant, as defined herein above, that contains at least one long chained alkenyl, oxyalkenyl (i.e., $O(CH_2)_n$), or polyoxyalkenyl group. As such, the long chained surfactant can include at least one alkenyl, oxyalkenyl, or polyoxyalkenyl group, wherein the group includes more than ten (i.e., between about eleven and about a thousand, between about eleven and about five hundred, or between about eleven and about a hundred) atoms in the chain. Preferably, the long chained surfactant can include at least one alkenyl, oxyalkenyl, or polyoxyalkenyl group, wherein the group includes more than twenty atoms in the chain. More preferably, the long chain can include at least one alkenyl, oxyalkenyl, or polyoxyalkenyl group, wherein the group includes more than twenty-five atoms in the chain. One suitable long chained surfactant is brij® 58 (i.e., polyoxyethylene(20) cetyl ether), which includes a polyoxyalkenyl group of 36 carbon atoms in the chain (i.e., $(OCH_2CH_2)_{20}$).

In one embodiment, surfactant 224 and slurries 222 are mixed such that surfactant 224 is at least 100 parts per million (ppm) to slurries 222 to form polishing solution 202. In one such embodiment, polishing solution 202 includes a mix of surfactant 224 at 200 ppm to slurries 222. It should be understood that a liquid medium may be used with slurries 222 and surfactant 224. Such a liquid medium may be an aqueous solution. Further, though pumps are shown for the embodiments described herein, it should be understood that gravity, air pressure or other forms of feed systems may be used.

Advantageously, the introduction of a long chained surfactant into slurries to form a polishing solution used in conjunction with CMP processing of a wafer provides for the reduction of roughness in layers (e.g., oxide interlayer dielectric (ILD) layers) of such wafers, especially for CMP processing using higher modulus polyurethane pads. For example, embodiments of the present invention reduce rough ILD conditions for a wafer during CMP processing of such a wafer. In particular, a long chained surfactant acts as possible, particle surface modifying agent, particle barrier layer (i.e., steric hindrance to reaction or inhibiting particle contact) or flow modifiers to reduce this roughening phenomenon.

Accordingly, this reduction of roughness reduces "chatter scratches" which are scratches that emanate from regions of a wafer that has undergone CMP processing. Advantageously, reduction in "chatter scratching" reduces cracking (i.e., "wormholing") in layers of the wafer that have been planarized. Therefore, reduction in cracking decreases access of cleaning chemistries to underlying structures of the wafer during subsequent chemical cleaning of the planarized wafer, thereby reducing damage to such underlying structures (e.g., reduction of metal voids in underlying metal structures). In one embodiment, the layers planarized or removed from wafer assembly 220 include an oxide layer (e.g., a silicon dioxide layer). Though a conventional platen CMP system 200 is illustratively shown, it should be appreciated by those of ordinary skill in the art that embodiments of the present invention may be used with a web-based CMP system. In a web-based CMP system, a webbing is moved between two locations, conventionally by feed and take-up rollers. The webbing takes the place of a CMP pad, and like a CMP pad, the webbing may be configured with fixed abrasives, grooves or other CMP pad configurations.

Figure 3:
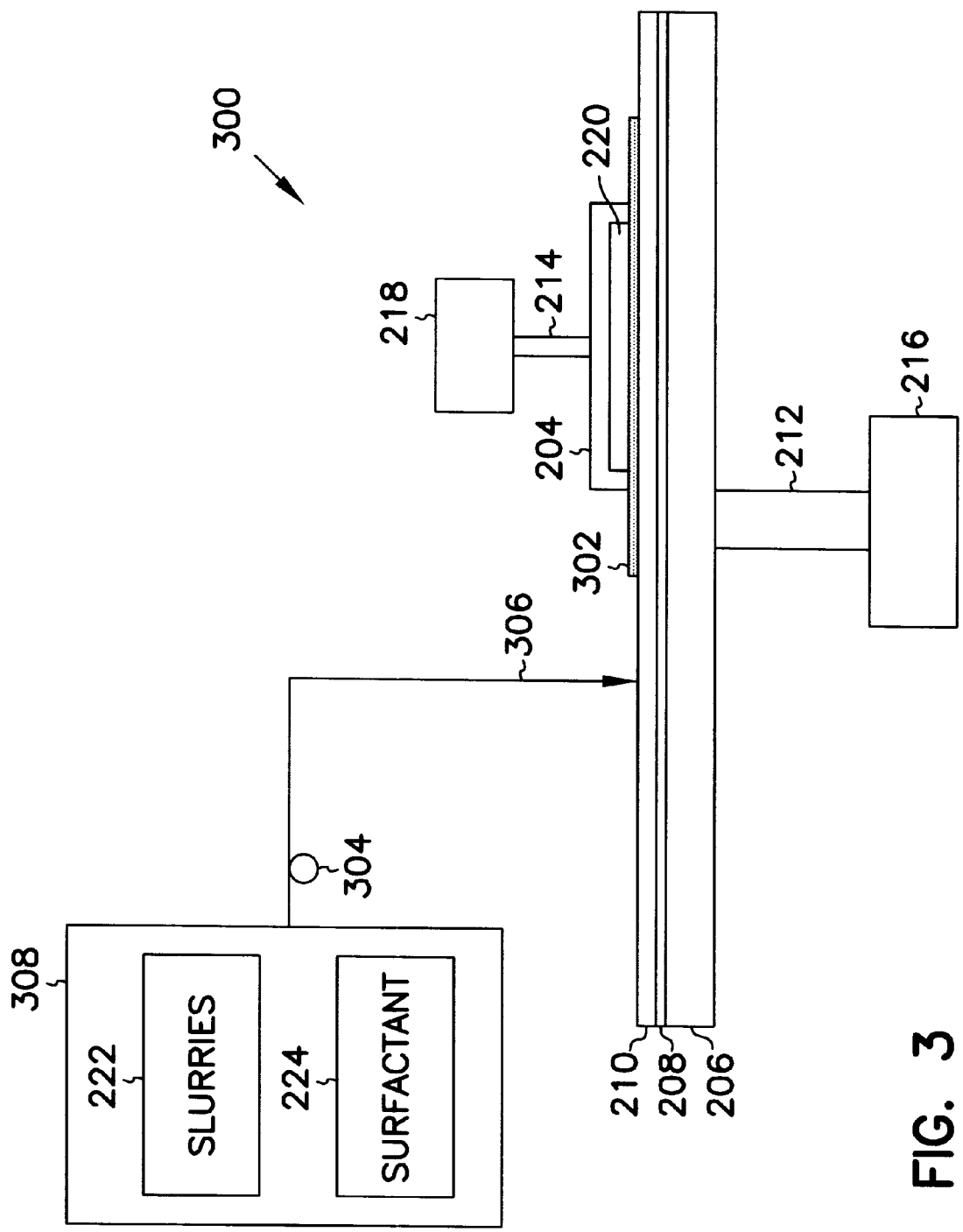
FIG. 3 is a cross-sectional view a portion of another embodiment of a CMP system in accordance with embodiments of the present invention.

Referring to FIG. 3, there is shown an alternative embodiment to CMP system 200 shown in FIG. 2. In particular, FIG. 3 includes CMP system 300 wherein slurries 222 and surfactant 224 are premixed prior to pumping by pump 304 to form polishing solution 302. This combination of slurries 222 and surfactant 224 is pumped from vessel 308 through feed-tube 306. Accordingly, polishing solution 302 is delivered and applied to CMP pad 210 for CMP processing of wafer assembly 220. In one embodiment, the layers planarized or removed from wafer assembly 220 include an oxide layer (e.g., a silicon dioxide layer).

Figure 4:
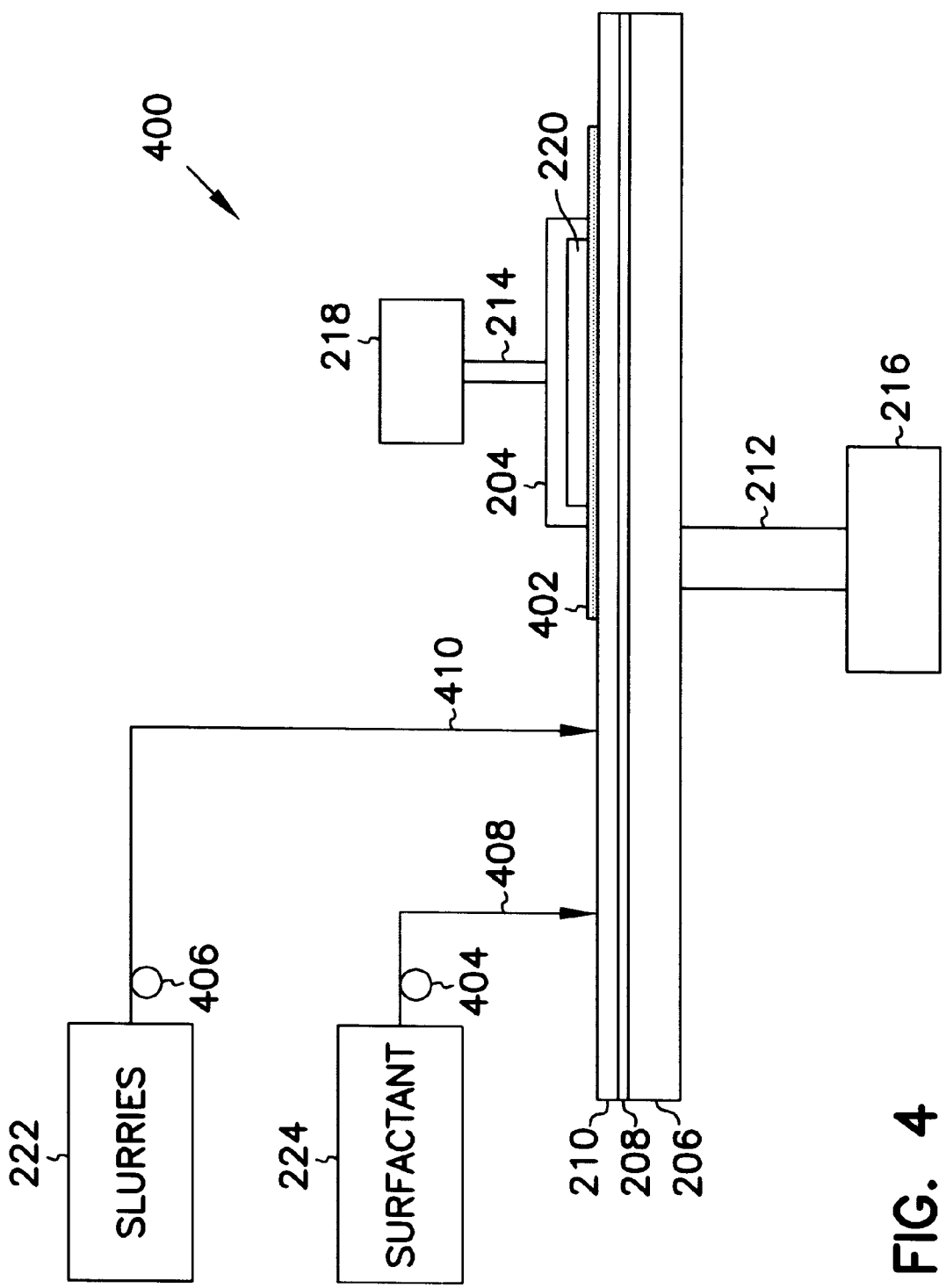
FIG. 4 is a cross-sectional view a portion of another embodiment of a CMP system in accordance with embodiments of the present invention.

Referring to FIG. 4, there is shown an alternative embodiment to CMP systems 200 and 300 shown in FIGS. 2 and 3, respectively. In particular, FIG. 4 includes CMP system 400 wherein slurries 222 and surfactant 224 are delivered separately to CMP pad 210 to form polishing solution 402. In particular, surfactant 224 and slurries 222 are pumped by pump 406 and 408 through feed tubes 408 and 410, respectively, down to the surface of CMP pad 402.

Figure 5A:
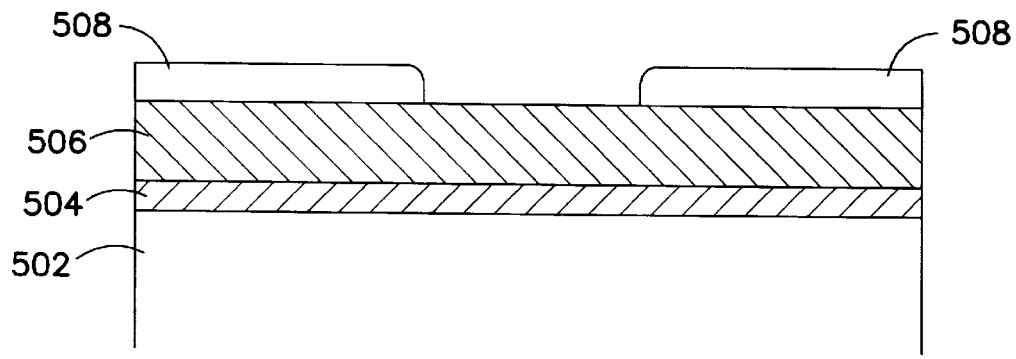
FIGS. 5A–5E illustrate an embodiment of an STI process incorporating the methods, compositions and structures formed therefrom as illustrated in FIGS. 2–4.
Figure 5B:
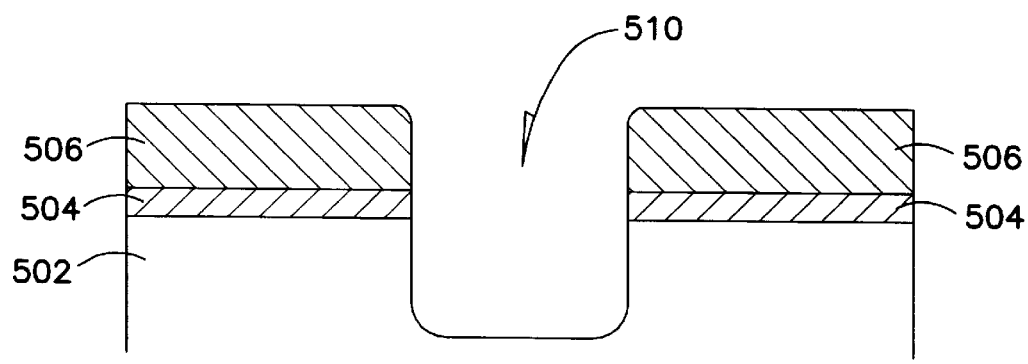
Figure 5C:
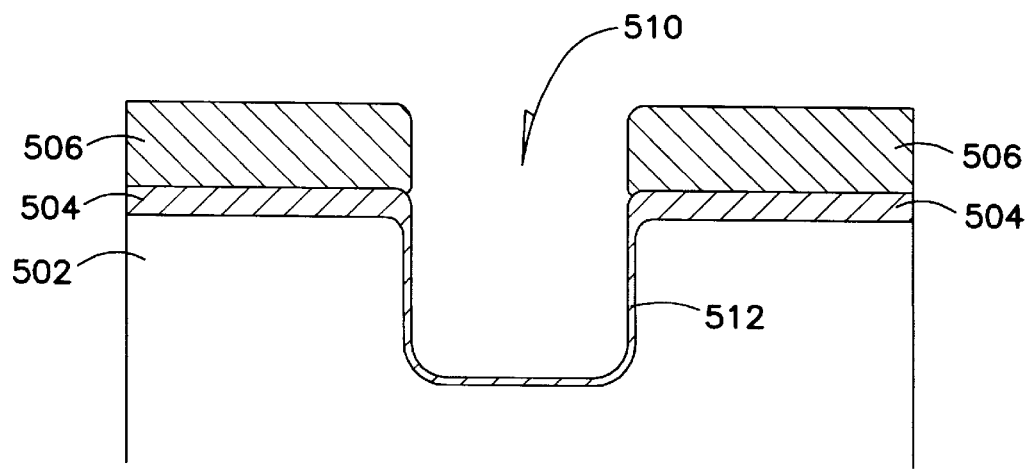
Figure 5D:
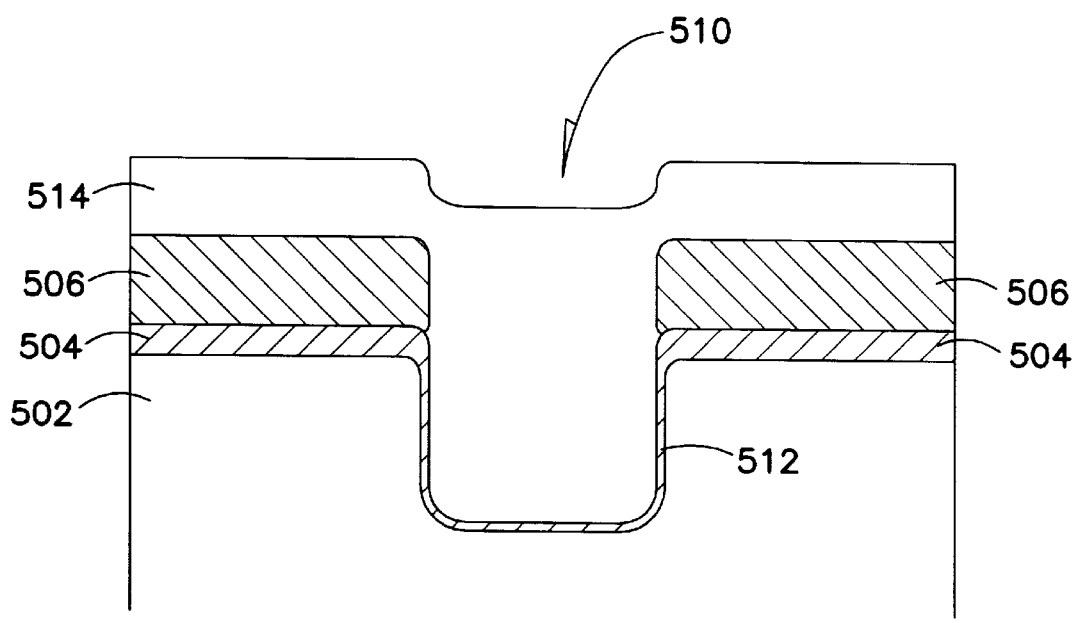
Figure 5E:
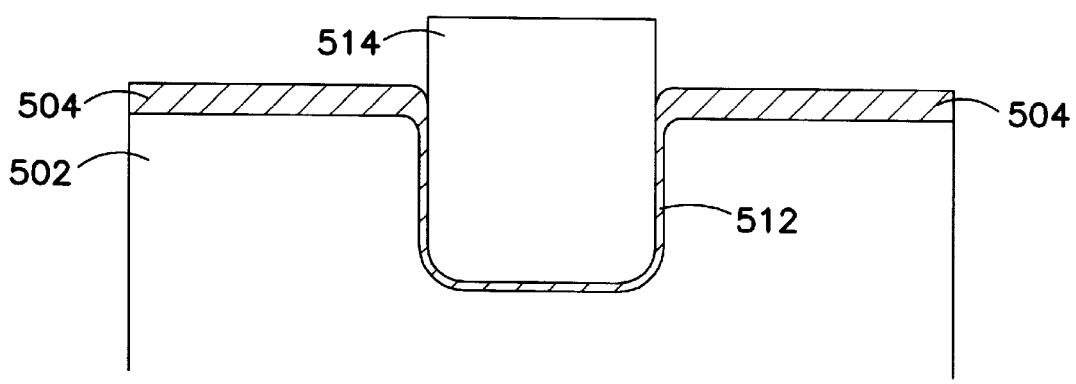

Moreover, in one embodiment, the methods, compositions and structures formed therefrom as illustrated in FIGS. 2–4 are incorporated into a shallow trench isolation (STI) process. FIGS. 5A–5E include one example of an STI process incorporating the methods, compositions and structures formed therefrom as illustrated in FIGS. 2–4. FIG. 5A includes substrate 502 on which oxide layer 504 is grown. Additionally, nitride layer 506 is deposited onto oxide layer 504. Resist 508 is then patterned onto nitride layer 506. Based on the pattern of resist 508, trench 510 is formed into substrate 502, as illustrated in FIG. 5B. In FIG. 5C, oxide liner 512 is grown on the sidewalls and bottom of trench 510 to server as a liner. In FIG. 5D, chemical vapor deposition (CVD) oxide 514 is deposited to fill trench 510. In FIG. 5E, CVD oxide 514 is planarized using CMP processing, as described above in conjunction with FIGS. 2–4. Accordingly, there is a reduction in the defects and chatter scratches during the STI CMP. In particular, there is a reduction in the defects and chatter scratches in oxide layer 504 and/or nitride layer 506.

CONCLUSION

Thus, improved methods, compositions and structures formed therefrom are provided that allow for reduction of roughness in layers (e.g., oxide layers) of a planarized wafer. In one such embodiment, improved methods, compositions and structures formed therefrom for reduction of roughness in layers (e.g., oxide layers) of a planarized wafer are used in conjunction with high modulus polyurethane pads. In one embodiment, improved methods, compositions and structures formed therefrom are provided that reduce rough interlayer dielectric (ILD) conditions for a wafer during CMP processing of such a wafer. Accordingly, this reduction of rough ILD reduces "chatter scratches" which are scratches that emanate from regions of a wafer that has undergone CMP processing. Advantageously, reduction in "chatter scratching" reduces cracking (i.e., "wormholing") in layers of the wafer that have been planarized. Therefore, reduction in cracking decreases access of cleaning chemistries to underlying structures of the wafer during subsequent chemical cleaning of the planarized wafer, thereby reducing damage to such underlying structures (e.g., reduction of metal voids in underlying metal structures).

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A method for forming a microelectronic substrate, comprising:

mixing a surfactant of at least 100 parts per million to slurries to form a polishing solution; and chemical-mechanical planarizing of the semiconductor wafer using the polishing solution.

2. The method of claim 1 wherein the surfactant is a long chained surfactant.

3. The method of claim 1 wherein the surfactant is a nonionic surfactant.

4. The method of claim 1 wherein the surfactant is a compound of the formula $CH_3R^1(OR^2)_nOH$, wherein $R^1$ is $(C_5–C_{50})$alkenyl, $R_2$ is $(C_2–C_8)$alkenyl, and n is about 5 to about 50.

5. The method of claim 4 wherein $R^1$ is $(CH_2)_{15}$.

6. The method of claim 4 wherein $R^2$ is $CH_2CH_2$.

7. The method of claim 4 wherein n is about 20.

8. The method of claim 1 wherein the surfactant is at least one of polyoxyethylene(4) lauryl ether; polyoxyethylene (23) lauryl ether; polyoxyethylene(2) cetyl ether; polyoxyethylene(10) cetyl ether; polyoxyethylene(20) cetyl ether; polyoxyethylene(2) steryl ether; polyoxyethylene(10) steryl ether; polyoxyethylene(20) steryl ether; polyoxyethylene(2) oleyl ether; polyoxyethylene(10) oleyl ether; polyoxyethylene(20) oleyl ether; and polyoxyethylene (100) steryl ether.

9. The method of claim 1 wherein the surfactant is polyoxyethylene(20) cetyl ether.

10. A method for forming a microelectronic substrate, comprising:

mixing a long chained surfactant at least 100 parts per million (ppm) to fumed silica slurries to form a polishing solution; and chemical-mechanical planarizing of the semiconductor wafer using the polishing solution.

11. The method of claim 10, further comprising applying the polishing solution at a polishing interface between a polymer polishing pad and the microelectronic substrate, wherein the polymer polishing pad has a polymer hardness of at least 60 Shore D.

12. The method of claim 10, further comprising applying the polishing solution at a polishing interface between a polymer polishing pad and the microelectronic substrate, wherein the polymer polishing pad has a moduli, flexural modulus of at least $0.5 \times 10^9$ Pascals (Pa) to $3 \times 10^9$ Pa at 30 degrees Celsius.

13. A method for forming a microelectronic substrate, comprising:
    mixing a long chained surfactant at least 100 parts per million (ppm) to slurries to form a polishing solution; and
    chemical-mechanical planarizing of the semiconductor wafer at a silicon dioxide layer using the polishing solution.

14. The method of claim 13, wherein chemical-mechanical planarizing of the semiconductor wafer at the silicon dioxide layer using the polishing solution includes chemical-mechanical planarizing of the semiconductor wafer at an interlayer dielectric layer using the polishing solution.

15. The method of claim 13, wherein mixing the long chained surfactant at least 100 ppm to slurries includes mixing the long chained surfactant at 200 ppm to slurries.

16. A method for chemical-mechanical planarizing (CMP) a substrate assembly, comprising:
    loading the substrate assembly into a CMP system, the CMP system having a polishing pad;
    providing a polishing solution, the polishing solution including a long chained surfactant at least 100 parts per million (ppm) to slurries;
    applying the polishing solution at a polishing interface between the polishing pad and the substrate assembly; and
    chemical-mechanical planarizing the substrate assembly using the polishing solution and the polishing pad.

17. The method of claim 16, further including mixing the long chained surfactant at least 100 parts per million (ppm) to slurries to form the polishing solution prior to delivery of the polishing solution to the polishing interface.

18. The method of claim 16, wherein applying the polishing solution at the polishing interface between the polishing pad and the substrate assembly includes applying the polishing solution at the polishing interface between a high modulus polyurethane pad and the substrate assembly.

19. The method of claim 16, wherein applying the polishing solution at the polishing interface between the polishing pad and the substrate assembly includes applying the polishing solution at the polishing interface between a polymer polishing pad and the substrate assembly, wherein the polymer polishing pad has a polymer hardness of at least 60 Shore D.

20. A method for chemical-mechanical planarizing (CMP) a substrate assembly, comprising:
    loading the substrate assembly into a CMP system, the CMP system having a polishing pad;
    providing a polishing solution, the polishing solution including a long chained surfactant molecule at least 100 parts per million (ppm) to fumed silica slurries;
    applying the polishing solution at a polishing interface between the polishing pad and the substrate assembly; and
    chemical-mechanical planarizing the substrate assembly using the polishing solution and polishing pad.

21. The method of claim 20, further including mixing in-line the long chained surfactant at least 100 parts per million (ppm) to slurries to form the polishing solution prior to applying the polishing solution at the polishing interface between the polishing pad and the substrate assembly.

22. A method for chemical-mechanical planarizing (CMP) a substrate assembly, comprising:
    loading the substrate assembly into a CMP system, the CMP system having a polishing pad;
    separately delivering a long chained surfactant and slurries to a polishing interface between the polishing pad and the substrate assembly;
    applying the long chained surfactant and the slurries to the polishing interface between the polishing pad and the substrate assembly, wherein the long chained surfactant is at least 100 parts per million (ppm) to the slurries being applied at the polishing interface; and
    chemical-mechanical planarizing the substrate assembly at a silicon dioxide layer using the polishing solution and polishing pad.

23. The method of claim 22, wherein providing the polishing solution includes providing a polishing solution that includes polyoxyethylene(20) cetyl ether at least 100 ppm to slurries.

24. A method for chemical-mechanical planarizing (CMP) a substrate assembly, comprising:
    loading the substrate assembly into a CMP system, the CMP system having a polishing pad;
    providing a polishing solution, the polishing solution including a long chained surfactant at least 100 parts per million (ppm) to fumed silica slurries;
    applying the polishing solution at a polishing interface between the polishing pad and the substrate assembly; and
    chemical-mechanical planarizing the substrate assembly at an interlayer dielectric layer using the polishing solution and polishing pad.

25. The method of claim 24, wherein providing the polishing solution includes providing a polishing solution that includes the long chained surfactant at 200 ppm to fumed silica slurries.

26. A method for mixing a polishing composition for chemical-mechanical planarizing of a semiconductor substrate, the method comprising:
    providing a long chained surfactant;
    providing slurries; and
    mixing the long chained surfactant at least 100 parts per million (ppm) to the slurries to form the polishing composition.

27. The method of claim 26, wherein mixing the long chained surfactant at least 100 ppm to slurries includes mixing polyoxyethylene(20) cetyl ether at least 100 ppm to slurries.

28. The method of claim 26, wherein mixing the long chained surfactant at least 100 ppm to fumed silica slurries includes mixing the long chained surfactant at 200 ppm to fumed silica slurries.

29. The method of claim 26, wherein the polishing composition is used to chemical-mechanical planarize the semiconductor substrate using a polymer polishing pad having a polymer hardness of at least 60 Shore D.

30. The method of claim 26, wherein the polishing composition is used to chemical-mechanical planarize the semiconductor substrate using a polymer polishing pad having a moduli, flexural modulus of at least $0.5 \times 10^9$ Pascals (Pa) to $3 \times 10^9$ Pa at 30 degrees Celsius.

31. A method for mixing a polishing composition for chemical-mechanical planarizing of a semiconductor substrate, the method comprising:

provided a long chained surfactant;

providing fumed silica slurries; and mixing the long chained surfactant at least 100 parts per million (ppm) to the fumed silica slurries to form the polishing composition.

32. The method of claim 31, wherein the polishing composition is used to chemical-mechanical planarize the semiconductor substrate at a silicon dioxide layer.

33. The method of claim 31, wherein the polishing composition is used to chemical-mechanical planarize the semiconductor substrate at an interlayer dielectric layer.

34. A polishing solution for chemical-mechanical planarizing a microelectronic substrate, comprising:

slurries; and a long chained surfactant at least 100 parts per million (ppm) to the slurries.

35. The polishing solution of claim 34, wherein the long chained surfactant includes polyoxyethylene(20) cetyl ether.

36. The polishing solution of claim 34, wherein the polishing solution is applied at a polishing interface between a polishing pad and the microelectronic substrate, wherein the polishing pad has a polymer hardness of at least 60 Shore D.

37. The polishing solution of claim 34, wherein the long chained surfactant at least 100 parts per million (ppm) to the slurries includes a long chained surfactant at 200 ppm to the slurries.

38. A polishing solution for chemical-mechanical planarizing a microelectronic substrate, comprising:

fumed silica slurries; and a long chained surfactant at least 100 parts per million (ppm) to the fumed silica slurries.

39. The polishing solution of claim 38, wherein the polishing solution is applied at a polishing interface between a polymer polishing pad and the microelectronic substrate at a silicon dioxide layer, wherein the polymer polishing pad has a polymer hardness of at least 60 Shore D.

40. The polishing solution of claim 38, wherein the polishing solution is applied at a polishing interface between a polishing pad and the microelectronic substrate at an interlayer dielectric layer, wherein the polishing pad has a moduli, flexural modulus of at least $0.5 \times 10^9$ Pascals (Pa) to $3 \times 10^9$ Pa at 30 degrees Celsius.

41. A microelectronic substrate without rough interlayer dielectric (ILD), wherein the microelectronic substrate is chemical-mechanical planarized using a polymer pad having a polymer hardness of at least 60 Shore D and having a moduli, flexural modulus of at least $0.5 \times 10^9$ Pascals (Pa) to $3 \times 10^9$ Pa at 30 degrees Celsius, formed by a process comprising:

mixing a long chained surfactant at least 100 parts per million (ppm) to slurries to form a polish solution; and chemical-mechanical planarizing of the semiconductor wafer using the polish solution.

42. The process of claim 41, wherein mixing the long chained surfactant at least 100 ppm to slurries includes mixing polyoxyethylene(20) cetyl ether at least 100 ppm to slurries.

43. A semiconductor wafer without chatter scratches in a silicon dioxide layer, wherein the semiconductor wafer is chemical-mechanical planarized using a polishing pad having a polymer hardness of at least 60 Shore D, formed by a process comprising:

mixing a long chained surfactant at least 100 parts per million (ppm) to slurries to form a polishing solution; and chemical-mechanical planarizing of the semiconductor wafer at the silicon dioxide layer using the polishing pad and the polishing solution.

44. The process of claim 43, wherein mixing the long chained surfactant at least 100 ppm to slurries includes mixing the long chained surfactant at 200 ppm to the slurries.

45. The process of claim 43, further comprising applying the polishing solution at a polishing interface between a polymer polishing pad and the microelectronic substrate, wherein the polymer polishing pad has a polymer hardness of at least 60 Shore D.

46. A substrate assembly without rough interlayer dielectric (ILD), wherein the substrate assembly is chemical-mechanical planarized using a pad having a modulus, flexural modulus of at least $0.5 \times 10^9$ Pascals (Pa) to $3 \times 10^9$ Pa at 30 degrees Celsius, formed by a process comprising:

mixing a long chained surfactant at least 100 parts per million (ppm) to fumed silica slurries to form a polish solution; and chemical-mechanical planarizing of the semiconductor wafer at an interlayer dielectric layer using the polish solution.

47. A substrate assembly without metal voids in a number of metal structures, wherein the substrate assembly is chemical-mechanical planarized (CMP) using a polishing pad having a polymer hardness of at least 60 Shore D, formed by a method comprising:

loading the substrate assembly into a CMP system;

providing a polishing solution, the polishing solution including a long chained surfactant at least 100 parts per million (ppm) to fumed silica slurries;

applying the polishing solution at a polishing interface between the polishing pad and the substrate assembly; and chemical-mechanical planarizing the substrate assembly at an interlayer dielectric layer using the polishing solution and the polishing pad.

48. The method of claim 47, wherein providing the polishing solution includes providing a polishing solution that includes polyoxyethylene(20) cetyl ether at least 100 ppm to fumed silica slurries.

49. The method of claim 47, wherein providing the polishing solution includes providing a polishing solution that includes the long chained surfactant at 200 ppm to fumed silica slurries.

50. A polishing composition for chemical-mechanical planarizing of a semiconductor substrate, wherein the polishing composition includes a long chained surfactant at least 100 parts per million (ppm) to fumed silica slurries, formed by a method comprising:

providing a long chained surfactant;

providing fumed silica slurries; and mixing the long chained surfactant at least 100 parts per million (ppm) to the fumed silica slurries to form the polishing composition.

51. The method of claim 50, wherein mixing the long chained surfactant at least 100 ppm to fumed silica slurries includes mixing polyoxycthylene(20) cetyl ether at least 100 ppm to fumed silica slurries.

52. The method of claim 50, wherein mixing the long chained surfactant at least 100 ppm to fumed silica slurries includes mixing the long chained surfactant at 200 ppm to fumed silica slurries.

53. A method for forming a substrate assembly, comprising:
mixing a long chained surfactant at least 100 parts per million (ppm) to fumed silica slurries to form a polish solution; and
chemical-mechanical planarizing of the semiconductor wafer at an interlayer dielectric layer using the polish solution.

54. The method of claim 53, wherein mixing the long chained surfactant at least 100 ppm to fumed silica slurries includes mixing polyoxyethylene(20) cetyl ether at least 100 ppm to fumed silica slurries.

55. The method of claim 53, wherein mixing the long chained surfactant at least 100 ppm to fumed silica slurries for mixing the long chained surfactant at 200 ppm to fumed silica slurries.

56. The method of claim 53, further comprising applying the polishing solution at a polishing interface between a polymer polishing pad and the microelectronic substrate, wherein the polymer polishing pad has a polymer hardness of at least 60 Shore D.

57. A method for chemical-mechanical planarizing (CMP) a substrate assembly, comprising:
loading the substrate assembly into a CMP system, the CMP system having a polishing pad;
providing a polishing solution, the polishing solution including a long chained surfactant at least 100 parts per million (ppm) to slurries;
applying the polishing solution at a polishing interface between the polishing pad and the substrate assembly; and
chemical-mechanical planarizing the substrate assembly at an interlayer dielectric layer using the polishing solution and the polishing pad.

58. The method of claim 57, wherein applying the polishing solution at the polishing interface between the polishing pad and the substrate assembly includes applying the polishing solution at the polishing interface between a polymer polishing pad and the substrate assembly, wherein the polymer polishing pad has a polymer hardness of at least 60 Shore D and a moduli, flexural modulus of at least $0.5 \times 10^9$ Pascals (Pa) to $3 \times 10^9$ Pa at 30 degrees Celsius.

59. The method of claim 57, wherein providing the polishing solution includes providing a polishing solution that includes polyoxyethylene(20) cetyl ether at least 100 ppm to slurries.

60. The method of claim 57, wherein providing the polishing solution includes providing a polishing solution that includes the long chained surfactant at 200 ppm to slurries.

61. A method for mixing a polishing composition for chemical-mechanical planarizing of a semiconductor substrate, the method comprising:
providing a long chained surfactant;
providing fumed silica slurries; and
mixing the long chained surfactant at least 100 parts per million (ppm) to the fumed silica slurries to form the polishing composition.

62. The method of claim 61, wherein mixing the surfactant at least 100 ppm to fumed silica slurries includes mixing polyoxyethylene(20) cetyl ether at least 100 ppm to fumed silica slurries.

63. The method of claim 61, wherein mixing the surfactant at least 100 ppm to fumed silica slurries includes means for mixing the surfactant at 200 ppm to fumed silica slurries.

* * * * *